US008288875B2

(12) United States Patent
Shimizu et al.

(10) Patent No.: US 8,288,875 B2
(45) Date of Patent: Oct. 16, 2012

(54) METHOD OF MANUFACTURING A SEMICONDUCTOR PACKAGE AND SEMICONDUCTOR PACKAGE HAVING AN ELECTRODE PAD WITH A SMALL PITCH

(75) Inventors: Noriyoshi Shimizu, Nagano (JP); Akio Rokugawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 75 days.

(21) Appl. No.: 12/749,117

(22) Filed: Mar. 29, 2010

(65) Prior Publication Data
US 2010/0244280 A1 Sep. 30, 2010

(30) Foreign Application Priority Data

Mar. 30, 2009 (JP) .............................. P.2009-081922

(51) Int. Cl.
H01L 23/48 (2006.01)
H01L 21/04 (2006.01)

(52) U.S. Cl. ............. 257/784; 257/E23.01; 257/E21.04; 257/773; 257/774; 257/700; 257/758; 257/778; 257/698

(58) Field of Classification Search ............... 257/784, 257/E23.01, E21.04, 773, 774, 778, 700, 257/758
See application file for complete search history.

(56) References Cited

U.S. PATENT DOCUMENTS

| 6,954,001 | B2 * | 10/2005 | Nakamura et al. | 257/738 |
| 2004/0041270 | A1 * | 3/2004 | Shimizu et al. | 257/758 |
| 2005/0253248 | A1 * | 11/2005 | Shimizu et al. | 257/700 |
| 2007/0138635 | A1 * | 6/2007 | Ikumo et al. | 257/738 |
| 2008/0018243 | A1 * | 1/2008 | Ishiguro et al. | 313/506 |
| 2008/0191357 | A1 | 8/2008 | Kouno et al. | |
| 2009/0196001 | A1 * | 8/2009 | Sunohara et al. | 361/781 |
| 2009/0302471 | A1 * | 12/2009 | Yamano | 257/750 |

FOREIGN PATENT DOCUMENTS

| JP | 2001-326466 | 11/2001 |
| JP | 2005086071 A | 3/2005 |
| JP | 2008182059 A | 8/2008 |

OTHER PUBLICATIONS

Office Action from corresponding Japanese Patent Application No. 2009-081922 issued on Jul. 10, 2012 and its English translation thereof (6 pages).

* cited by examiner

Primary Examiner — A O Williams
(74) Attorney, Agent, or Firm — Drinker Biddle & Reath LLP

(57) ABSTRACT

A board on which a wiring having an electrode pad is formed is prepared. A resist film is formed on the board in order to cover the wiring and then the resist film is left on the electrode pad through patterning. An inorganic insulating film is formed on the board in order to cover the wiring and then the resist film is removed, thereby removing the inorganic insulating film provided on the resist film to leave the inorganic insulating film between the wirings. A solder resist layer is formed on the board in order to cover the wiring and then the electrode pad is exposed.

9 Claims, 7 Drawing Sheets

METHOD OF MANUFACTURING A SEMICONDUCTOR PACKAGE AND SEMICONDUCTOR PACKAGE HAVING AN ELECTRODE PAD WITH A SMALL PITCH

This application claims priority to Japanese Patent Application No. 2009-081922, filed Mar. 30, 2009, in the Japanese Patent Office. The Japanese Patent Application No. 2009-081922 is incorporated by reference in its entirety.

TECHNICAL FIELD

The present disclosure relates to a semiconductor package and a manufacturing technique thereof, and more particularly to a technique which is effective for an application to a semiconductor package having an electrode pad with a small pitch which is formed on a printed board.

RELATED ART

JP-A-2001-326466 Publication (Patent document 1) has disclosed a technique for forming an insulating intermediate layer between an inner layer plate provided with a conductive pattern and a buildup resin layer, thereby reinforcing the buildup resin layer.

[Patent Document 1] JP-A-2001-326466 Publication

A semiconductor package has a printed board (an organic board) to be a core, a buildup resin layer formed on both surfaces or one of the surfaces in the printed board, and a wiring layer and a via which are formed on the buildup resin layer, for example.

FIGS. 16 and 17 are views for explaining a semiconductor package investigated by the inventors, illustrating a section of a main part of the semiconductor package. In FIG. 16, the semiconductor package has an electrode pad 102a formed on a buildup resin layer 101, a solder resist layer 103 formed as a top surface layer of the semiconductor package in order to cover the electrode pad 102a, and an electrode bump 104 formed on the electrode pad 102a. In FIG. 17, moreover, the semiconductor package has an uppermost wiring layer 102 formed on the buildup resin layer 101, and the solder resist layer 103 formed to cover the wiring layer 102.

In the semiconductor package, for example, the electrode bump 104 is set to have a small pitch of approximately 150 μm, a distance between the electrode pads 102a is set to be approximately 30 μm and L/S (line and space) of the wiring 102 is set to be equal to or smaller than 10 μm in some cases. In the design rule, a migration between the electrode pads 102a or a migration between the wirings 102 causes a problem so that a reliability of the semiconductor package is influenced. If the electrode pad 102a and the wiring 102 are formed by using copper (Cu) as a principal component, for example, a migration occurring due to a copper ion causes a problem.

For example, if the semiconductor package is continuously used for a long period of time in a high temperature and high humidity environment, an insulation deterioration occurs in the solder resist layer 103 between the electrode pads 102a as shown in FIG. 16. With a further progress, a short circuit is caused by the migration in some cases. As shown in FIG. 17, moreover, a foreign substance sticks to the buildup resin layer 101 so that a conductive passage is formed, and the copper ion is moved due to the migration between the wirings 102 because of presence of an electric field, resulting in a deposition or corrosion of a metal in some cases.

In the semiconductor package, furthermore, an adhesion (an adhesiveness) between layers, for example, between the buildup resin layer 101 and the electrode pad 102a or between the electrode pad 102a and the electrode bump 104 causes a problem so that the reliability of the semiconductor package is influenced. For example, in some cases in which the semiconductor package is continuously used for a long period of time in a high temperature and high humidity environment, peeling is caused between the layers so that water enters a portion between the layers.

SUMMARY

Exemplary embodiments of the present invention provide a technique capable of enhancing a reliability of a semiconductor package.

A method of manufacturing a semiconductor package, according to an exemplary embodiment of the invention comprises steps of:

(a) preparing a board on which a wiring having an electrode pad is formed;

(b) forming a resist film on the board in order to cover the wiring and then leaving the resist film on the electrode pad through patterning;

(c) forming an inorganic insulating film on the board in order to cover the wiring and then removing the resist film, thereby removing the inorganic insulating film provided on the resist film to leave the inorganic insulating film between the wirings after the step (b); and (d) forming a solder resist layer on the board in order to cover the wiring and then exposing the electrode pad after the step (c).

According to the exemplary embodiments of the present invention, a reliability of a semiconductor package can be enhanced.

Other features and advantages may be apparent from the following detailed description, the accompanying drawings and the claims.

DETAILED DESCRIPTION

Figure 1:
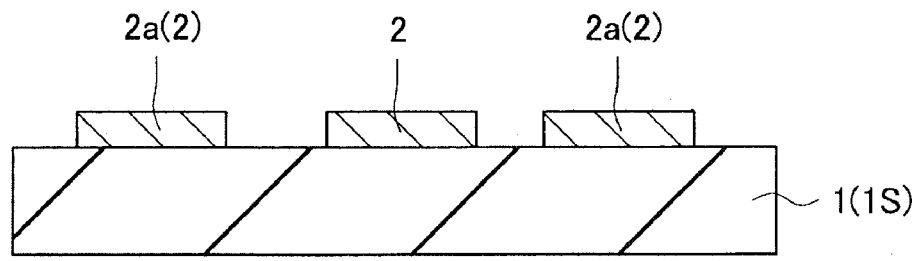
FIGS. 1 to 6 show a method of manufacturing a semiconductor package according to a first embodiment of the invention.

Embodiments according to the invention will be described below in detail with reference to the drawings. In all of the drawings for explaining the embodiments, members having the same functions have the same reference numerals and repetitive description thereof will be omitted in some cases.

(First Embodiment)

A method of manufacturing a semiconductor package according to the embodiment will be described with reference to FIGS. 1 to 6. As shown in FIG. 7, a semiconductor package 20 has, as a final configuration, a structure having a printed board (a board 1S) serving as a core, buildup resin layers 1 formed on both surfaces of the board 1S, and wirings 2 formed on the buildup resin layers 1, for example.

First of all, as shown in FIG. 1, there is prepared the board 1S on which the wiring 2 having an electrode pad 2a is formed. In FIG. 1, the buildup resin layer 1 formed as a top surface layer of the board 1S is indicated as the board 1S. The electrode pad 2a is formed integrally when a conductor film containing copper (Cu) as a principal component is subjected to patterning to form the wiring 2, for example. Moreover, an epoxy resin or a prepreg can be used for the buildup resin layer 1, for example, and the buildup resin layer 1 has an insulating property.

Next, the wiring 2 including the electrode pad 2a is subjected to a roughening treatment. The roughening treatment for the wiring 2 is carried out to enhance an adhesion to an inorganic insulating film to be formed on the wiring 2 at a subsequent step, and a surface of the wiring 2 is set to be a roughened surface having a roughness of approximately 1 to 2 μm. As the roughening treatment for the wiring 2 containing Cu as a principal component, it is possible to apply a black oxidation treatment, a CZ treatment or a neobrown treatment.

In the black oxidation treatment, the board 1S is immersed in a solution which mainly contains sodium hydroxide and sodium chlorite to oxidize a Cu surface, thereby forming a roughened surface. Consequently, a needle-like oxide film is provided on the Cu surface so that minute concavo-convex portions are formed. Thus, it is possible to enhance the adhesion of the inorganic insulating film to be formed on the surface by an anchor effect.

In the CZ treatment, a solution containing a formic acid as a principal component is sprayed onto the Cu surface to carry out etching over Cu, thereby forming a roughened surface. In the neobrown treatment, moreover, an immersing or spraying treatment is carried out by using a hydrogen peroxide based/hydrogen sulfate based solution. Thus, the Cu surface is subjected to etching so that the roughened surface is formed. Referring to the CZ treatment and the neobrown treatment, there is obtained an etching shape along a grain boundary of Cu. Consequently, it is possible to enhance the adhesion of the inorganic insulating film to be formed on the surface by the anchor effect.

Figure 2:
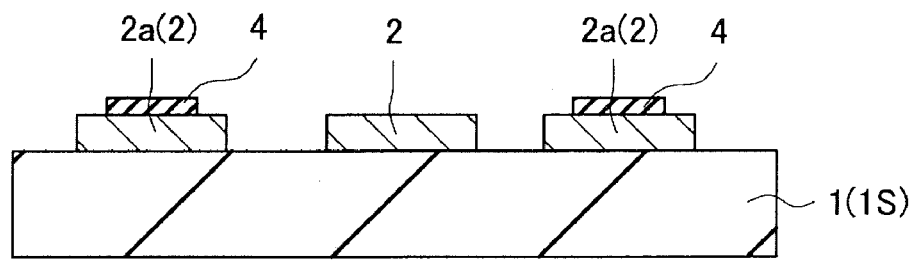

Subsequently, a resist film 4 is formed on the board 1S in order to cover the wiring 2. As shown in FIG. 2, then, the resist film 4 is left on the electrode pad 2a through patterning. For the resist film 4, a liquid photosensitive resist or a dry film resist (DFR) is used, for example. In the embodiment, the resist film 4 is left on a part of the electrode pad 2a.

Figure 3:
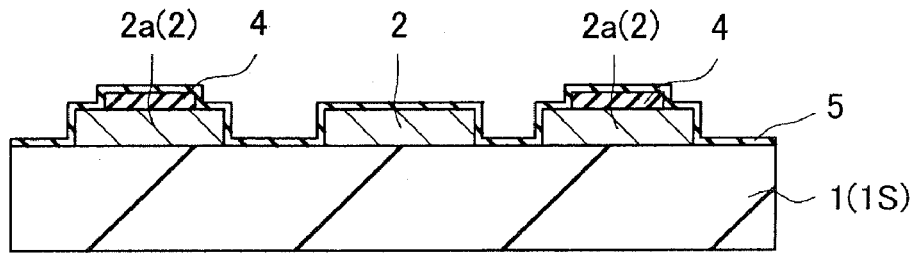

As shown in FIG. 3, thereafter, an inorganic insulating film 5 to be an insulating film having an excellent water resistance and adhesion is formed on the board 1S in order to cover the wiring 2 including the electrode pad 2a. In other words, the inorganic insulating film 5 is formed to cover surfaces of the board 1S, the resist film 4 and the wiring 2. The inorganic insulating film 5 is silicon oxide (such as $SiO_2$) with which the whole surface of the board 1S is coated by a plasma CVD (Chemical Vapor Deposition) method, for example. The inorganic insulating film 5 is set to have a thickness which is equal to or greater than a roughness of the roughened surface. In the case in which the roughened surface (surface) of the wiring 2 is set to have a roughness of Ra=approximately 1 to 2 μm, the thickness of the inorganic insulating film 5 is set to be approximately 1 to 2 μm. In the case in which the thickness is smaller than the roughness of the roughened surface, a defect is caused in the inorganic insulating film 5 so that an insulation cannot be obtained. On the other hand, in the case in which the thickness is excessively greater than the roughness of the roughened surface, it is impossible to cope with a reduction in a pitch.

The inorganic insulating film 5 can also be formed by a sputtering method. In contrast with the sputtering method, however, the plasma CVD method is effective for a formation of a film at a low temperature, an enhancement in an adhesion of the wiring 2 (for example, copper) and the inorganic insulating film 5 (for example, silicon oxide) and an improvement in a uniformity and a throwing power.

By using the plasma CVD method, for example, it is possible to form the inorganic insulating film 5 at a low temperature of approximately 100° C. Consequently, it is possible to form the inorganic insulating film 5 at a temperature which is equal to or lower than a heat-resistant temperature (for example, 180° C.) of the buildup resin layer 1 or the printed board to be used as the core of the board 1S. By using TEOS (tetraethoxysilane) as a gas for CVD, moreover, it is also possible to form a silicon oxide film having an excellent adhesion on a side surface of the wiring 2 including the electrode pad 2a, between the wirings 2 having a small interval or between the electrode pads 2a. Furthermore, it is also possible to apply silicon nitride (for example, SiN) as the inorganic insulating film 5. The silicon nitride film can enhance a humidity resistance more greatly than the silicon oxide film.

Figure 4:
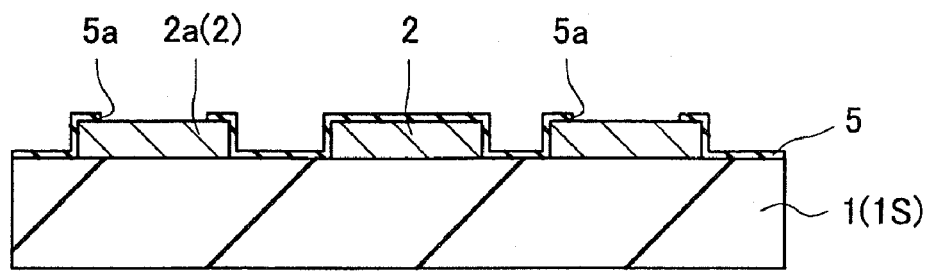

As shown in FIG. 4, subsequently, the left resist film 4 is removed, and furthermore, the inorganic insulating film 5 provided on the resist film 4 is removed to expose the electrode pad 2a by a lift-off method. In other words, the resist film 4 is removed so that the inorganic insulating film 5 provided on the resist film 4 is removed. Thus, the inorganic insulating film 5 is left between the wirings 2. As will be described below, it is possible to suppress an occurrence of a migration between the wirings 2 or between the electrode pads 2a by the inorganic insulating film 5 provided between the wirings 2.

At the step shown in FIG. 4, in the case in which the DFR is used as the resist film 4, the resist film 4 is peeled by aqueous sodium hydroxide or an amine based peeling solution. In the case in which a liquid photosensitive resist is used for the resist film 4, moreover, the resist film 4 is peeled by a solvent or $O_2$ ashing. In the embodiment, at the step shown in FIG. 2, the resist film 4 is left on a part of the electrode pad 2a and the inorganic insulating film 5 is then formed. Therefore, the resist film 4 is removed so that an opening portion 5a for exposing the electrode pad 2a is formed on the inorganic insulating film 5.

Figure 5:
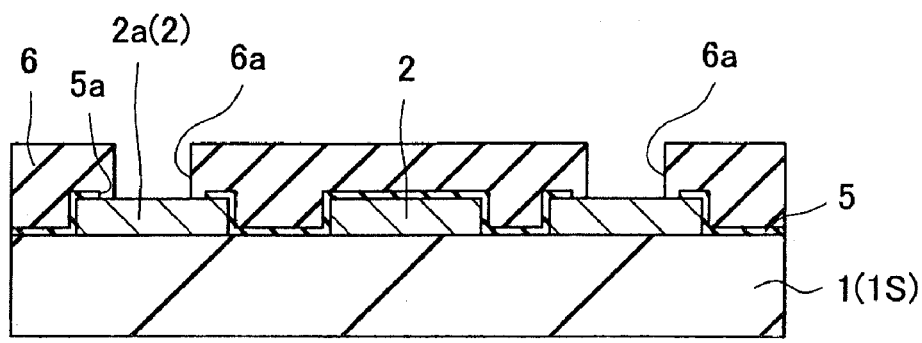

Subsequently, a solder resist layer 6 is formed on the board 1S in order to cover the wiring 2 including the electrode pad 2a. As shown in FIG. 5, then, the solder resist layer 6 is subjected to patterning in order to expose the electrode pad 2a. The solder resist layer 6 subjected to the patterning is formed by screen printing, for example. In the embodiment, the electrode pad 2a is exposed and an opening portion 6a to be a smaller opening (opening diameter) than the opening portion 5a (opening diameter) is thereafter formed on the solder resist layer 6.

As the solder resist layer 6, for example, it is possible to use a material obtained by containing silica or a photopolymerization initiator in an epoxy based resin, a modified epoxy resin or an acrylate based resin, and the solder resist layer 6 has an insulating property. The solder resist layer 6 to be a top surface layer in the semiconductor package 20 is resistant to a heat temperature (approximately 260° C.) of soldering and a performance for protecting a circuit from an environment such as a heat or a humidity is more excellent than that of the buildup resin layer 1 to be an inner layer.

Figure 6:
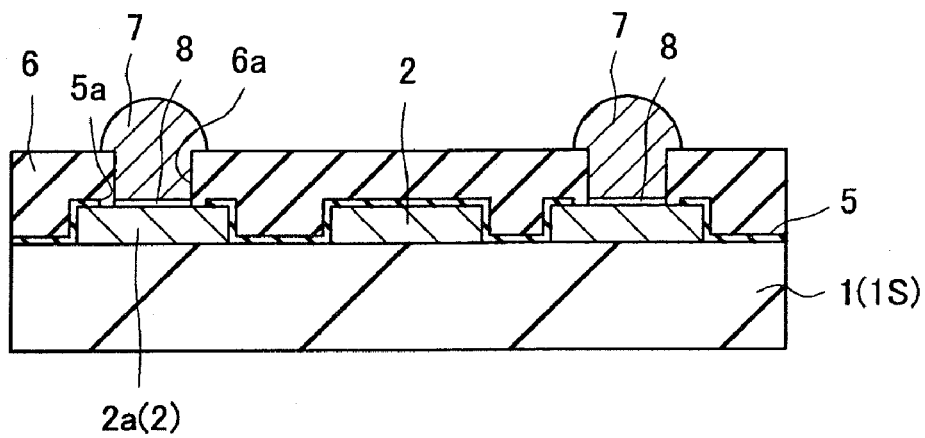
Figure 7:
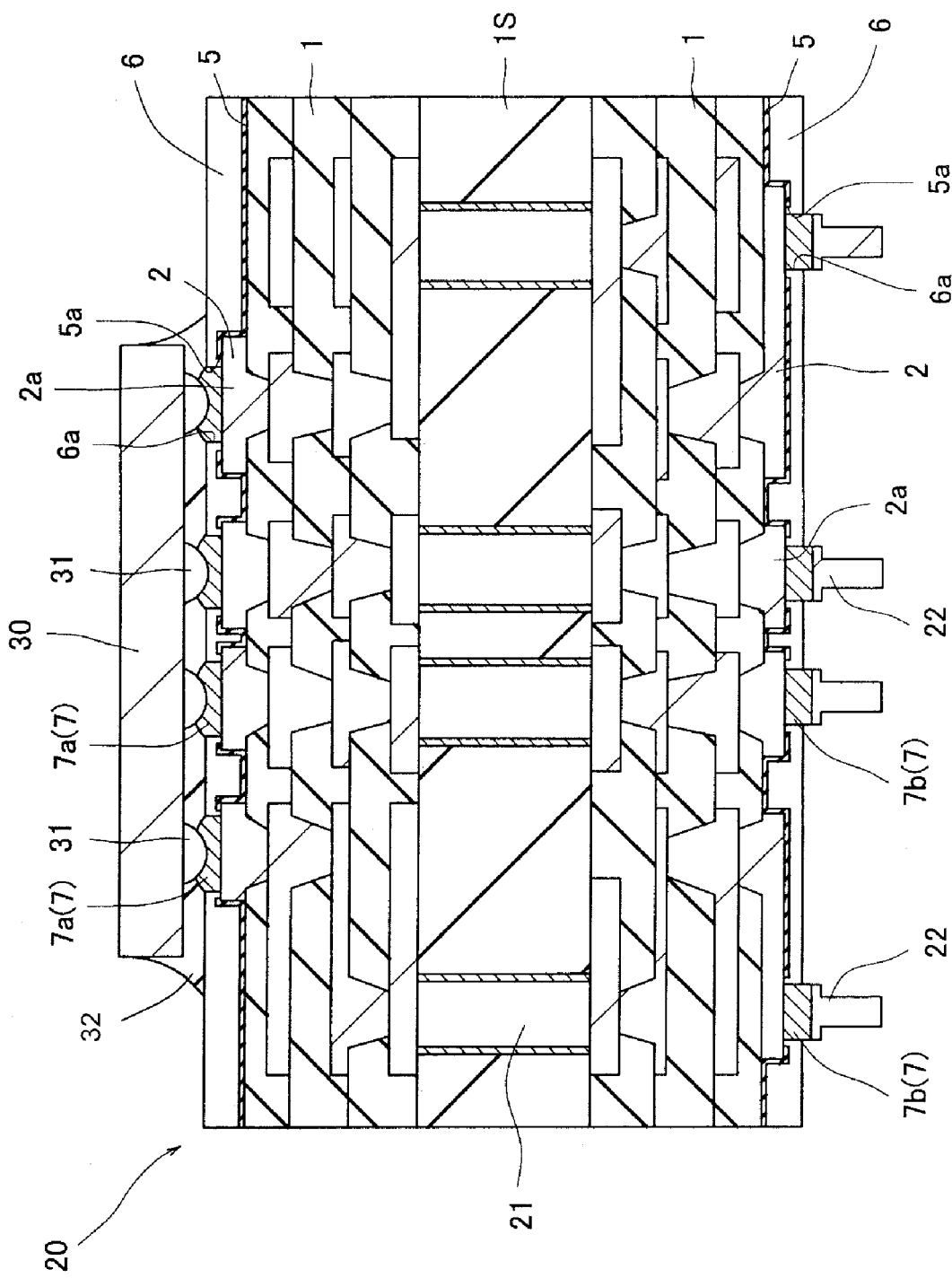
FIG. 7 shows a sectional view showing a semiconductor device according to the first embodiment of the invention.

As shown in FIG. 6, subsequently, there is formed an electrode bump 7 serving as an external electrode which is to be electrically connected to the electrode pad 2a. More specifically, an UBM (Under Barrier Metal) film 8 is formed, by a plating method, on the electrode pad 2a exposed from the opening portion 6a of the solder resist layer 6, and the electrode bump 7 constituted by a solder bump is then formed on the UBM film 8 through solder printing. The UBM film 8 is formed by sequentially providing an Ni (nickel) and Au (gold) or sequentially providing an Ni, Pd (palladium) and Au, on the electrode pad 2a exposed from the opening portion 6a of the solder resist layer 6 so that the Au film becomes an uppermost layer of the UBM film 8. Moreover, the electrode bump 7 may be formed by mounting a solder ball on the UBM film 8.

It is possible to form the semiconductor package 20 shown in FIG. 7 through the steps. The semiconductor package 20 includes the board 1S on which the wiring 2 having the electrode pad 2a is formed, the inorganic insulating film 5 formed to cover the wiring 2 and having the opening portion 5a on the electrode pad 2a, the solder resist layer 6 formed to cover the wiring 2 and the inorganic insulating film 5 and having, on the electrode pad 2a, the opening portion 6a to be the smaller opening than the opening portion 5a, and the electrode bump 7 (7a, 7b) to be the external electrode which is provided in the opening portion 6a and is electrically connected to the electrode pad 2a.

In the semiconductor package 20, it is possible to constitute a semiconductor device by flip-chip mounting a semiconductor chip 30 through the electrode bump 7a. The semiconductor chip 30 is mounted on the semiconductor package 20 in a state in which an electrode bump 31 to be an external electrode thereof is electrically connected to the electrode bump 7a. An underfill resin 32 is formed between the semiconductor chip 30 and the semiconductor package 20. In the semiconductor package 20, moreover, an electrode pin 22 connected electrically to the electrode bump 7b is formed on the electrode pad 2a at a back face which is opposite to a mounting surface of the semiconductor chip 30.

In the board 1S, furthermore, a printed board is used as a core board, and the buildup resin layer (insulating layer) 1 and the wiring 2 are formed on both surfaces thereof and the wirings 2 on the both surface sides are electrically connected to each other via a through hole 21. Accordingly, the electrode pin 22 to be the external electrode of the semiconductor device is electrically connected to the semiconductor chip 30. It is possible to mount the semiconductor device on a mother board through the electrode pin 22, for example. In addition, the inorganic insulating film 5 is provided on the both surfaces of the semiconductor package 20. Therefore, it is possible to prevent water from entering an inner part of the package more suitably. Consequently, it is possible to enhance a reliability of the semiconductor package and the semiconductor device.

Although the electrode bump 7b and the electrode pin 22 are bonded to form an external connecting terminal in the semiconductor package 20 shown in FIG. 7, it is also possible to use the electrode bump 7b itself as the external connecting terminal without providing the electrode pin 22. Moreover, it is also possible to use the electrode pad 2a itself as the external connecting terminal without providing the electrode pin 22 and the electrode bump 7b.

In the embodiment, furthermore, the description has been given to the case in which the printed board is used as the core board. For the semiconductor package, however, the invention can also be applied to a coreless package in which only the buildup resin layer (the insulating layer) and the wiring are provided and the core board is not provided.

Figure 16:
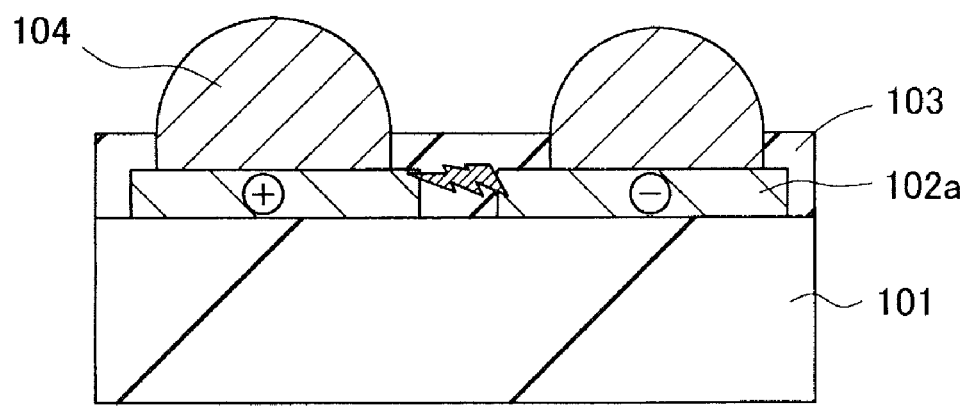
FIGS. 16 and 17 are sectional views for explaining a semiconductor package investigated by the inventors.
Figure 17:
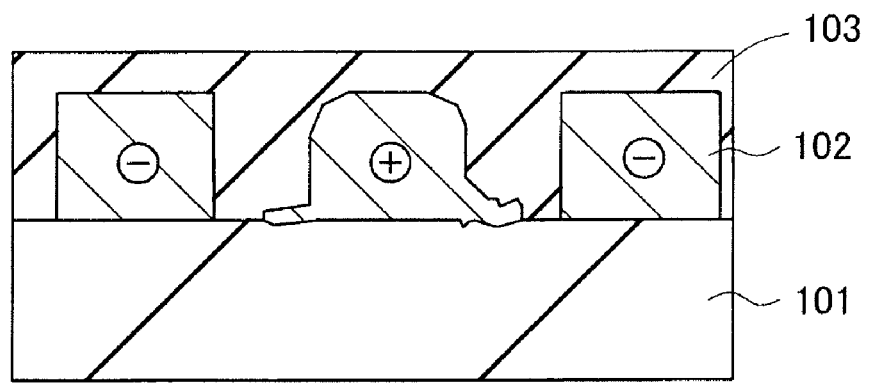

As described with reference to FIGS. 16 and 17, in the structure in which the electrode pad 102a and the wiring 102 are directly covered with the solder resist layer 103, the reliability of the semiconductor package (the semiconductor device) is influenced when a migration occurs between the electrode pads 102a or between the wirings 102.

In the embodiment, therefore, there is employed the structure in which the wiring 2 having the electrode pad 2a is protected (coated) with the inorganic insulating film 5 and the solder resist layer 6 is formed thereon as shown in FIG. 6. By the structure, water entering from a surface of the solder resist layer 6 is blocked by the inorganic insulating film 5 so that the water can be prevented from reaching the wiring 2 having the electrode pad 2a (which contains copper as a principal component, for example). Moreover, the inorganic insulating film 5 is provided between the wirings 2 and between the electrode pads 2a. Therefore, it is possible to suppress the occurrence of the migration. As the material to be provided therebetween, moreover, the inorganic insulating film 5 (for example, silicon oxide or silicon nitride) is used. Consequently, it is possible to enhance the adhesion of the wiring 2 and the electrode pad 2a. According to the embodiment, thus, it is possible to provide the semiconductor package 20 having the reliability enhanced.

Figure 8:
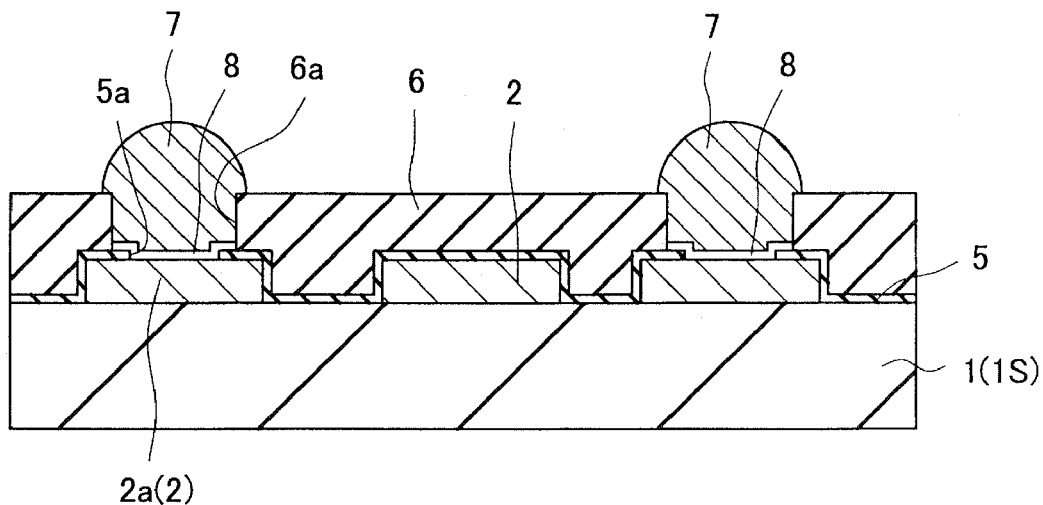
FIG. 8 is a sectional view showing a modified example of the semiconductor package according to the first embodiment of the invention.
Figure 9:
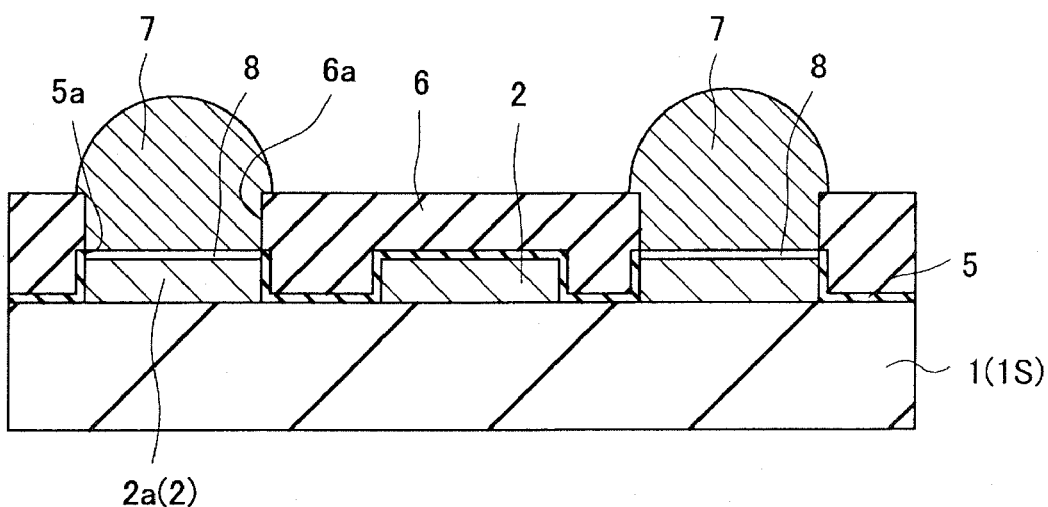
FIG. 9 is a sectional view showing a further modified example of the semiconductor package according to the first embodiment of the invention.

For the structure in which the wiring 2 having the electrode pad 2a is coated with the inorganic insulating film 5 and the solder resist layer 6 is formed thereon, moreover, it is also possible to propose structures shown in FIGS. 8 and 9. FIG. 8 shows the structure in which the opening portion 5a (the opening diameter) of the inorganic insulating film 5 is smaller than the opening portion 6a (the opening diameter) of the solder resist layer 6. FIG. 9 shows the structure in which the opening portion 5a (the opening diameter) of the inorganic insulating film 5 and the opening portion 6a (the opening diameter) of the solder resist layer 6 are formed as the openings having an equal size to the electrode pad 2a.

By regulating the sizes, it is possible to form the opening portion 5a of the inorganic insulating film 5 and the opening portion 6a of the solder resist layer 6 in the structures shown in FIGS. 8 and 9 at the steps described with reference to FIGS. 4 and 5, respectively. For example, with the structure illustrated in FIG. 8, it is preferable to expose the electrode pad 2a, thereby forming, on the solder resist layer 6, the opening portion 6a which is larger than the opening portion 5a of the inorganic insulating film 5 at the step shown in FIG. 5. With the structure illustrated in FIG. 9, moreover, the resist film 4 is formed on the whole surface of the electrode pad 2a at the step shown in FIG. 2 and the opening portion 5a of the inorganic insulating film 5 which exposes the whole surface of the electrode pad 2a is formed at the step shown in FIG. 4. Then, it is preferable to expose the electrode pad 2a and to form, on the solder resist layer 6, the opening portion 6a having an equal size to the opening portion 5a of the inorganic insulating film 5 at the step shown in FIG. 5.

With the structure shown in FIG. 8, the electrode pad 2a is coated with the inorganic insulating film 5 in non-contact with the solder resist layer 6. Therefore, it can be supposed that the suppression of the migration is more effective. With the structure shown in FIG. 9, moreover, the electrode pad 2a is not provided in contact with the solder resist layer 6 and the electrode bump 7 is formed through the UBM film 8 from the opening portions 5a and 6a having the equal size to the electrode pad 2a. Therefore, it can be supposed that the suppression of the migration is more effective, and furthermore, an adhesion area of the electrode pad 2a and the electrode bump 7 is the largest and a bonding strength is high.

In contrast with the structures, in the structure shown in FIG. 6, the opening portion 5a of the inorganic insulating film 5 is formed to be larger than the opening portion 6a of the solder resist layer 6. With the structure shown in FIG. 6, even if it is hard to align the opening portion 5a of the inorganic insulating film 5 with the opening portion 6a of the solder resist layer 6 as shown in FIG. 9, it is possible to form them including a dimension error. Therefore, it is possible to enhance a manufacturing yield of the semiconductor package. With the structure shown in FIG. 6, moreover, the inorganic insulating film 5 is not provided between the electrode pad 2a and the electrode bump 7 as shown in FIG. 8. Consequently, the adhesion of the electrode bump 7 and the electrode pad 2a can be prevented from being reduced so that the reliability of the semiconductor package 20 can be enhanced.

(Second Embodiment)

A method of manufacturing a semiconductor package according to the embodiment will be described with reference to FIGS. 10 to 12. Overlapping description with the first embodiment will be omitted in some cases.

In the same manner as the step described with reference to FIG. 1, first of all, there is prepared a board 1S on which a wiring 2 having an electrode pad 2a is formed, and the wiring 2 including the electrode pad 2a is then subjected to a roughening treatment through a black oxidation treatment, a spraying treatment or a neobrown treatment, for example.

Figure 10:
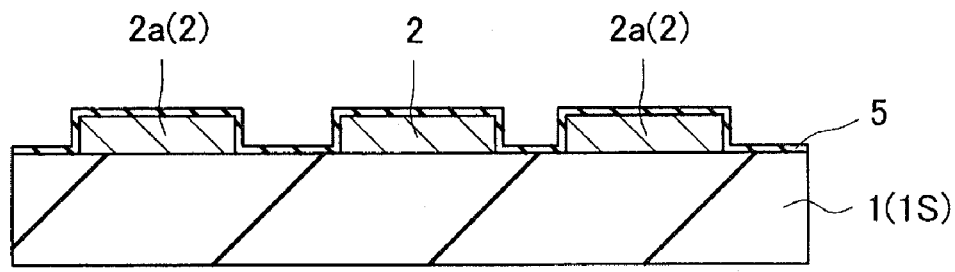
FIGS. 10 to 12 show a method of manufacturing a semiconductor package according to a second embodiment of the invention.
Figure 11:
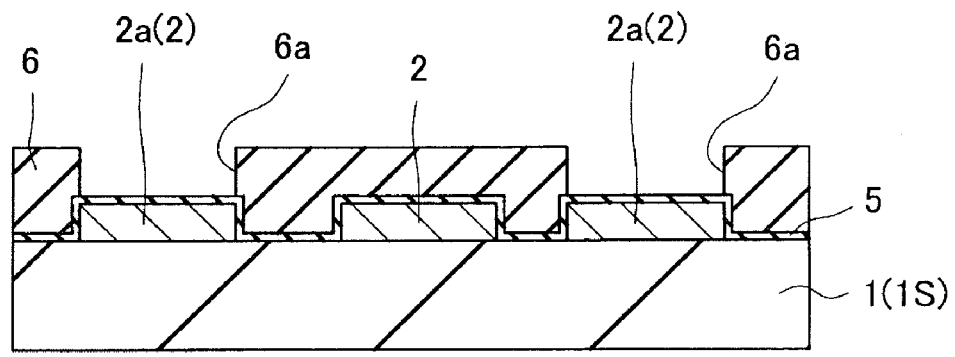

As shown in FIG. 10, subsequently, an inorganic insulating film 5 is formed on the board 1S in order to cover the wiring 2. The inorganic insulating film 5 is silicon oxide (for example, $SiO_2$) with which a whole surface of the board 1S is coated by a plasma CVD method, for example.

Then, a solder resist layer 6 is formed on the board 1S in order to cover the inorganic insulating film 5. As shown in FIG. 11, thereafter, the solder resist layer 6 provided on the electrode pad 2a is removed (patterned). Consequently, an opening portion 6a for exposing the inorganic insulating film 5 provided on the electrode pad 2a is formed on the solder resist layer 6.

Figure 12:
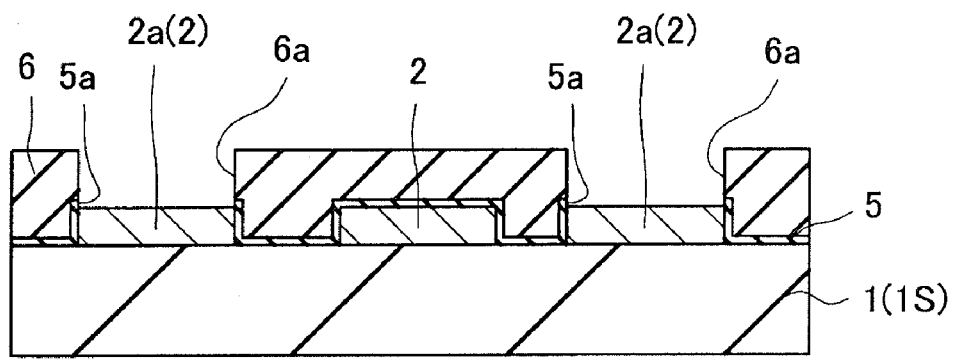

As shown in FIG. 12, next, the inorganic insulating film 5 provided on the electrode pad 2a is removed through plasma etching by using the left solder resist layer 6 as a mask, for example, and the electrode pad 2a is thus exposed. Consequently, an opening portion 5a for exposing the electrode pad 2a is formed on the inorganic insulating film 5. The etching is carried out based on the opening portion 6a of the solder resist layer 6. Therefore, the opening portion 5a of the inorganic insulating film 5 and the opening portion 6a have an equal size.

In the same manner as the step described with reference to FIG. 9, subsequently, there is formed an electrode bump 7 to be an external electrode which is electrically connected to the electrode pad 2a. More specifically, an Ni/Au or Ni/Pd/Au UBM film 8 is formed, by a plating method, on the electrode pad 2a exposed from the opening portion 6a of the solder resist layer 6, and the electrode bump 7 constituted by a solder bump is then formed on the UBM film 8 through solder printing.

Also in the embodiment, as shown in FIG. 9, there is employed the structure in which the wiring 2 having the electrode pad 2a is protected (coated) by the inorganic insulating film 5, and the solder resist layer 6 is formed thereon. By the structure, it is possible to enhance a water resistance and to suppress an occurrence of a migration. As a material to be provided, moreover, the inorganic insulating film 5 is used. Therefore, it is possible to enhance an adhesion. According to the embodiment, thus, it is possible to improve a reliability of the semiconductor package.

Although the lift-off method has been used in the first embodiment, moreover, the opening portion 5a for exposing the electrode pad 2a can be formed on the inorganic insulating film 5 with high precision by the plasma etching (dry etching) using the solder resist layer 6 as a mask in the embodiment. Although a step of forming and removing a resist film 4 is required for the lift-off method, furthermore, the step is not necessary in the embodiment. Therefore, it is possible to reduce a manufacturing cost of the semiconductor package.

(Third Embodiment)

Figure 13:
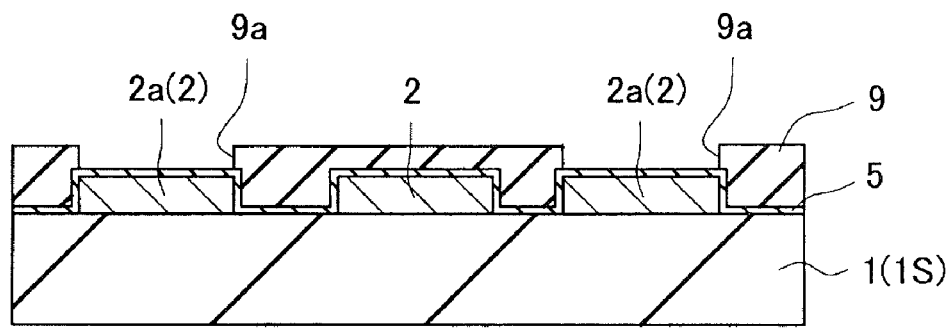
FIGS. 13 to 15 show a method of manufacturing a semiconductor package according to a third embodiment of the invention.

A method of manufacturing a semiconductor package according to the embodiment will be described with reference to FIGS. 13 to 15. Overlapping description with the first and second embodiments will be omitted in some cases.

In the same manner as the step described with reference to FIG. 1, first of all, there is prepared a board 1S on which a wiring 2 having an electrode pad 2a is formed, and the wiring 2 including the electrode pad 2a is then subjected to a roughening treatment through a black oxidation treatment, a spraying treatment or a neobrown treatment, for example.

In the same manner as the step described with reference to FIG. 10, subsequently, an inorganic insulating film 5 is formed on the board 1S in order to cover the wiring 2. The inorganic insulating film 5 is silicon oxide (for example, $SiO_2$) with which a whole surface of the board 1S is coated by a plasma CVD method, for example.

Then, a resist film 9 is formed on the board 1S in order to cover the inorganic insulating film 5. As shown in FIG. 13, thereafter, the resist film 9 provided on the electrode pad 2a is removed (patterned). Consequently, an opening portion 9a for exposing the inorganic insulating film 5 provided on the electrode pad 2a is formed on the resist film 9. As the resist film 9, for example, a liquid photosensitive resist or a dry film resist (DFR) is used.

Figure 14:
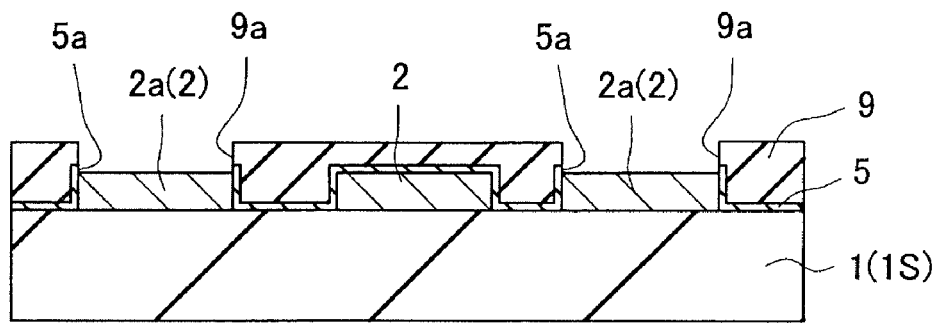

As shown in FIG. 14, next, the inorganic insulating film 5 provided on the electrode pad 2a is removed through plasma etching by using the left resist film 9 as a mask, for example, and the electrode pad 2a is thus exposed. Consequently, an opening portion 5a for exposing the electrode pad 2a is formed on the inorganic insulating film 5. The etching is carried out based on the opening portion 9a of the resist film 9. Therefore, the opening portion 5a of the inorganic insulating film 5 and the opening portion 9a have an equal size.

Figure 15:
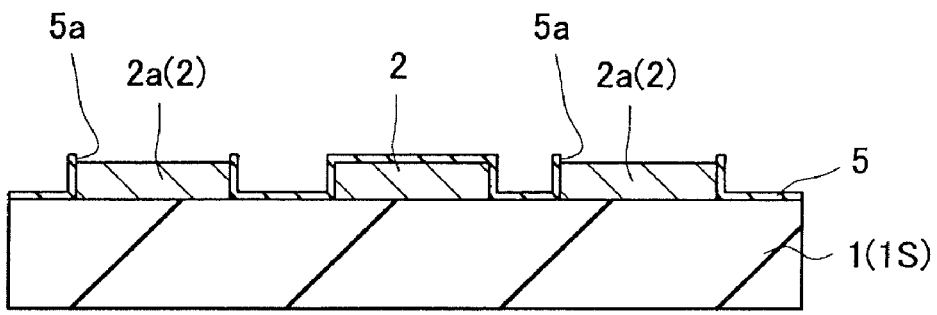

As shown in FIG. 15, then, the left resist film 9 is removed. In the case in which the DFR is used as the resist film 9, the resist film 9 is peeled by aqueous sodium hydroxide or an amine based peeling solution. In the case in which a liquid photosensitive resist is used for the resist film 9, moreover, the resist film 9 is peeled by a solvent or $O_2$ ashing. Next, a solder resist layer 6 is formed on the board 1S in order to cover the wiring 2 and the electrode pad 2a is thereafter exposed. Consequently, a structure shown in FIG. 12 is obtained.

In the same manner as the step described with reference to FIG. 9, subsequently, there is formed an electrode bump 7 serving as an external electrode which is to be electrically connected to the electrode pad 2a. More specifically, an Ni/Au or Ni/Pd/Au UBM film 8 is formed, by a plating method, on the electrode pad 2a exposed from an opening portion 6a of the solder resist layer 6, and the electrode bump 7 constituted by a solder bump is then formed on the UBM film 8 through solder printing.

Also in the embodiment, as shown in FIG. 9, there is employed the structure in which the wiring 2 having the electrode pad 2a is protected (coated) by the inorganic insulating film 5, and the solder resist layer 6 is formed thereon. By the structure, it is possible to enhance a water resistance and to suppress an occurrence of a migration. As a material to be provided, moreover, the inorganic insulating film 5 is used. Therefore, it is possible to enhance an adhesion. According to the embodiment, thus, it is possible to improve a reliability of the semiconductor package.

As described with reference to FIG. 12 in the second embodiment, moreover, the opening portion 5a of the inorganic insulating film 5 is formed through the plasma etching by using the solder resist layer 6 as a mask. For this reason, the solder resist layer 6 is damaged. In the embodiment, however, the opening portion 5a of the inorganic insulating film 5 is formed and the solder resist layer 6 is then formed without the damage. Therefore, it is possible to enhance a reliability of the semiconductor package.

Furthermore, in the second embodiment, the opening portion 5a of the inorganic insulating film 5 is formed by using the solder resist layer 6 as a mask. For this reason, the opening portion 5a of the inorganic insulating film 5 has the equal size to the opening portion 6a of the solder resist layer 6. In the embodiment, the solder resist layer 6 is formed after the opening portion 5a of the inorganic insulating film 5 is formed. Therefore, it is possible to regulate the size of the opening portion 6a.

The invention is widely utilized in the manufacturing industry for a semiconductor package, particularly, a semiconductor package having an electrode pad with a small pitch which is formed on a printed board.

What is claimed is:

1. A semiconductor package comprising:
   a board on which an insulating layer made of a resin and a wiring having an electrode pad is formed, the wiring layer being on top of the insulating layer;
   an inorganic insulating film formed to cover the wiring and the board, and having a first opening portion on the electrode pad; and
   a solder resist layer formed to cover the inorganic insulating film and having, on the electrode pad, a second opening portion, the first and second opening portions formed such that an upper surface of the electrode pad is exposed.

2. The semiconductor package according to claim 1 further comprising:
   an external electrode which is provided in the second opening portion and is electrically connected to the electrode pad.

3. The semiconductor package according to claim 1, wherein the second opening portion of the solder resist layer is smaller than the first opening portion of the inorganic insulating film.

4. The semiconductor package according to claim 1, wherein the second opening portion of the solder resist layer is larger than the first opening portion of the inorganic insulating film.

5. The semiconductor package according to claim 1, wherein the inorganic insulating film is a silicon oxide film or a silicon nitride film.

6. The semiconductor package according to claim 1, wherein the solder resist layer is made of an insulating resin.

7. The semiconductor package according to claim 1, further comprising:
   an insulating layer made of a resin formed on the board, wherein
   the wiring is formed on the insulating layer, and
   the inorganic insulating film is formed to cover the insulating layer and the wiring.

8. The semiconductor package according to claim 2, wherein the external electrode is a solder bump.

9. The semiconductor package according to claim 1, wherein the inorganic insulation film has a thickness that is substantially thinner than the wiring, and thicker or with a same thickness as a surface roughness of the wiring.

* * * * *